(12) United States Patent
Totzeck et al.

(10) Patent No.: US 7,728,975 B1
(45) Date of Patent: Jun. 1, 2010

(54) METHOD FOR DESCRIBING, EVALUATING AND IMPROVING OPTICAL POLARIZATION PROPERTIES OF A MICROLITHOGRAPHIC PROJECTION EXPOSURE APPARATUS

(75) Inventors: Michael Totzeck, Schwaebisch Gmuend (DE); Heiko Feldmann, Schwaebisch Gmuend (DE); Daniel Kraehmer, Aalen (DE); Olaf Dittmann, Bopfingen (DE)

(73) Assignee: Carl Zeiss SMT AG, Oberkochen (DE)

( * ) Notice: Subject to any disclaimer, the term of this patent is extended or adjusted under 35 U.S.C. 154(b) by 876 days.

(21) Appl. No.: 11/358,119

(22) Filed: Feb. 22, 2006

Related U.S. Application Data

(60) Provisional application No. 60/655,563, filed on Feb. 23, 2005.

(51) Int. Cl.
*G01J 4/00* (2006.01)
(52) U.S. Cl. .......................... 356/364; 356/71; 356/124
(58) Field of Classification Search ............. 356/71–73, 356/364, 124
See application file for complete search history.

(56) References Cited

U.S. PATENT DOCUMENTS 5,910,940 A * 6/1999 Guerra .................... 369/275.1
6,252,712 B1    6/2001 Fürter et al.
6,285,443 B1    9/2001 Wangler et al.
7,286,245 B2 * 10/2007 Wegmann et al. ........... 356/521
7,304,736 B2 * 12/2007 Westbrook .................. 356/364
2003/0206289 A1  11/2003 Matsuyama
2005/0136340 A1 *  6/2005 Baselmans et al. ............. 430/5

FOREIGN PATENT DOCUMENTS

DE         103 28 938 A1    1/2005

OTHER PUBLICATIONS

Russell A. Chipman, Polarization Analysis of Optical Systems, Optical Engineering, Feb. 1989, pp. 090-099, vol. 28, No. 2.
James P. McGuire, Jr. et al., Polarization Aberrations, 1. Rotationally Symmetric Optical Systems, Applied Optics, Aug. 1, 1994, pp. 5080-5100, vol. 33, No. 22.
E. Hecht, "Optics," second edition (1987), pp. 321-323.

* cited by examiner

*Primary Examiner*—Gregory J. Toatley, Jr.
*Assistant Examiner*—Iyabo S Alli
(74) *Attorney, Agent, or Firm*—Sughrue Mion, PLLC

(57) ABSTRACT

In a method for describing, evaluating and improving optical polarization properties of a projection objective of a microlithographic projection exposure apparatus, the Jones or Stokes vectors are firstly determined at one or more points in the exit pupil of the projection objective. These are then described at least approximately as a linear superposition of predetermined vector modes with scalar superposition coefficients. The optical polarization properties can subsequently be evaluated on the basis of the superposition coefficients.

27 Claims, 7 Drawing Sheets

METHOD FOR DESCRIBING, EVALUATING AND IMPROVING OPTICAL POLARIZATION PROPERTIES OF A MICROLITHOGRAPHIC PROJECTION EXPOSURE APPARATUS

CROSS-REFERENCE TO RELATED APPLICATIONS

This application claims benefit of provisional application U.S. 60/655,563 filed on Feb. 23, 2005.

BACKGROUND OF THE INVENTION

1. Field of the Invention

The invention relates to microlithographic projection exposure apparatus, such as those used for the production of large-scale integrated electrical circuits and other microstructured components. The invention relates in particular to a method by which the optical polarization properties of such apparatus can be evaluated and improved.

2. Description of Related Art

Integrated electrical circuits and other microstructured components are conventionally produced by applying a plurality of structured layers to a suitable substrate which, for example, may be a silicon wafer. In order to structure the layers, they are first covered with a photoresist which is sensitive to light of a particular wavelength range, for example light in the deep ultraviolet (DUV) spectral range. The wafer coated in this way is subsequently exposed in a projection exposure apparatus. A pattern of diffracting structures, which is arranged on a reticle, is then imaged onto the photoresist with the aid of a projection objective. Since the imaging scale is generally less than one, such projection objectives are also often referred to as reduction objectives.

After the photoresist has been developed, the wafer is subjected to an etching process so that the layer becomes structured according to the pattern on the reticle. The remaining photoresist is then removed from the remaining parts of the layer. This process is repeated until all the layers have been applied to the wafer.

One of the essential aims in the development of microlithographic projection exposure apparatus is to be able to generate structures with smaller and smaller dimensions on the wafer, so as to thereby increase the integration density of the components to be produced. By using a wide variety of measures, it is now possible to generate structures on the wafer whose dimensions are less than the wavelength of the projection light being used.

Particular importance is in this case attached to the polarization state of the projection light arriving on the photoresist. This is because the polarization state has a direct effect on the contrast which can be achieved, and therefore the minimum size of the structures to be generated. This is related to the fact that the reticle diffracts the transmitted projection light into different diffraction orders, which interfere in the image plane and thereby produce the image of the reticle. The interference phenomena between different diffraction orders are commensurately more pronounced as the polarization states of the interfering diffraction orders are similar. Full constructive or destructive interference between two diffraction orders is possibly only if they are polarized in the same way.

The polarization dependency of the contrast becomes particularly noticeable in projection objectives with high numerical apertures, such as those which are possible in immersion objectives. In the case of projection light which is polarized perpendicularly to the incidence plane (s-polarization), the interference phenomena of two plane waves which lie in the same incidence plane are independent of the angle at which the different diffraction orders arrive on the photoresist.

In the case of projection light polarized parallel to the incidence plane (p-polarization), however, different diffraction orders can no longer interfere fully since the diffraction orders have different polarization directions. The interference phenomena are then commensurately weaker as the angles with respect to the optical axis, at which the diffraction orders arrive on the photoresist, are large. If the propagation directions of the interfering diffraction orders in the resist form a right angle, then the polarization vectors are mutually perpendicular and interference no longer takes place at all. If the included angle is more than 90° then although the contrast increases again, the regions of constructive and destructive interference which correspond to regions of maximum and minimum intensity nevertheless become interchanged relative to the case with an included angle of less than 90°. The differences in the interference behavior between s-polarized and p-polarized projection light are therefore particularly important in projection objectives with a high numerical aperture.

For this reason, attempts are made to configure the optical subsystems of the projection exposure apparatus, i.e. the illumination system and the projection objective, so that the projection light in the image plane is optimally polarized. A homogeneous s-polarization is often sought for the aforementioned reasons; under certain circumstances, for example in the case of projection objectives with a small numerical aperture, it may be more expedient to have other polarization states such as circularly polarized or completely unpolarized projection light.

The polarization distribution which is set up in the image plane depends on a multiplicity of factors. The polarization state of the projection light, with which the illumination system of the projection exposure apparatus illuminates the reticle, naturally has a very significant effect. Besides this, every optical interface alters to a greater or lesser extent the polarization state of light which does not arrive perpendicularly on the interface. Many of the optical materials used in projection objectives are furthermore intrinsically birefringent or have induced birefringence, and therefore also modify the polarization state of the projection light. Filters and other manipulators, by which the polarization state can be deliberately affected and corrected, are furthermore known.

Optimum configuration and correction of the projection exposure apparatus in terms of optical polarization requires that the effects and imaging errors associated with the polarization state can be described and evaluated in a way which is straightforward, physically as informative as possible but nevertheless precise.

SUMMARY OF THE INVENTION

It is therefore an object of the invention to provide a method for evaluating optical polarization properties of an optical system of a microlithographic projection exposure apparatus, and in particular an illumination system or a projection objective, which satisfies the aforementioned requirements.

It is also an object of the invention to provide a method for producing such an optical system, in which the optical polarization properties are improved by using a quality function.

It is a further object of the invention to provide a method for improving the optical polarization properties of an optical system of a microlithographic projection exposure apparatus, in which optical polarization properties are modified. The invention furthermore relates to a projection exposure apparatus with which the method can be carried out.

With respect to the evaluation of optical polarization properties, the aforementioned object is achieved by a method having the following steps:

a) determining the Jones vectors at least at some points in the exit pupil of the optical system;
b) at least approximately describing the Jones vectors determined in step a) as a linear superposition of predetermined vector modes with scalar superposition coefficients;
c) evaluating the optical polarization properties on the basis of the superposition coefficients.

Describing the Jones vectors in the exit pupil as a linear, superposition of predetermined vector modes with scalar superposition coefficients makes it possible, for any image point, to describe and evaluate the distribution of the Jones vectors in the exit pupil in a straightforward and—with a suitable choice of the vector modes—physically informative way. With the aid of the superposition coefficients, it is possible to compare the optical polarization conditions in a straightforward way, not only between individual image points but also between different projection objectives or illumination systems. The evaluation of the optical polarization properties with the aid of the superposition coefficients may be carried out according to similar principles as in the case of describing wavefronts with the aid of known function systems, for example the Zernike polynomials.

With a suitable choice of the vector polynomials, it is also possible for particular imaging errors, which are attributable to polarization effects, to be assigned to particular optical elements or types of optical elements. This makes it easier to avoid or correct such imaging errors.

With a suitable choice of the vector modes, it is furthermore possible to separate rotationally symmetric and azimuthally varying components of the distribution of the Jones vectors in the exit pupil from one another. This is expedient in so far as rotationally symmetric image errors are generally less critical and easier to correct than those image errors which vary azimuthally.

In the case of vector modes which describe azimuthally varying components with manifold symmetry, imaging errors attributable to the polarization state can even be assigned to particular optical elements. Depending on the orientation of the crystal lattices, for example, optically birefringent materials such as calcium fluoride ($CaF_2$) exhibit birefringence distributions with manifold symmetry. Such symmetries lead to corresponding manifold components of the Jones vectors in the exit pupil, and can therefore be corrected independently of other components.

The evaluation of the optical polarization properties according to the invention also makes it possible to carry out various measures during the initial configuration of the optical system, during its fine tuning before initial use and even during operation, by which the optical polarization properties can be improved.

The term Jones vector generally refers to the vector of the electric field strength, including the phase information contained in it. When the Jones vectors are described as a linear superposition according to step b), the phase information is incorporated into the complex superposition coefficients. Information about the wavefront profile can therefore also be derived from the superposition coefficients.

Here, however, the Jones vector will also refer to the vector of the electric field strength from which the phase information has been removed. The Jones vectors then correspond to the vectors which are used to describe polarization states in the scope of Jones matrix calculus. It is more favourable to use Jones vectors without the phase to evaluate the optical polarization properties, since the phase information cannot readily be evaluated with the aid of the complex superposition coefficients. Other known methods are generally more suitable for describing and evaluating the phase information, for example decomposition of the phase distribution into Zernike polynomials.

The vector modes used for the description in step b) should represent a complete and orthogonal function system. A complete function system allows an arbitrary distribution of Jones vectors to be approximated with any desired accuracy by a linear superposition. An orthogonal function system ensures that the chosen decomposition into vector modes is unique.

In particular cases, however, it may be more favorable to use a system of vector modes which is not complete and/or not orthogonal for describing the Jones vectors. This is expedient, for example, when the vector modes of such a function system are physically very informative, or if the distribution of the Jones vectors in the exit pupil can be described by particularly few non-zero superposition coefficients.

The components of the vector modes may contain polynomials which themselves represent a complete orthogonal function system.

In this case, it is particularly preferable for only one component of each vector mode to be non-zero. The vector modes defined in this way therefore describe the polarization directions separately in different dimensions of the chosen coordinate system. This is found to be particularly expedient for evaluating the optical polarization properties.

The determination of the Jones vectors in the exit pupil may be carried out in a wide variety of ways. In pre-existing optical systems, for example, it might be suitable to measure the Jones vectors with the aid of polarimetric measuring instruments which are known per se. Yet since the optical systems of microlithographic projection exposure apparatus are generally specified very accurately, it is also possible to determine the Jones vectors by means of simulation. For optical systems which are still at the design stage, simulation in any case represents the only possibility for determining the Jones vectors.

A method according to the invention for producing an optical system, which achieves the object stated in the introduction, therefore comprises the following steps:

compiling a design for the optical system;

evaluating optical polarization properties of the designed optical system according to the method described above;

establishing a quality function which incorporates the superposition coefficients determined in step b) of the method described above;

compiling a modified design so that the quality function is improved.

Various measures may be employed when modifying the design for the optical system in order to improve the quality function. For example, it is possible to rotate birefringent optical elements about the optical axis. It is also feasible to use specially optimized polarization-correcting optical elements, which reduce the deviations of the optical polarization properties from the specifications. Such an element may, for example, be a reflection or antireflection coating which might already be present, the optical polarization effect of which is suitably tuned. A birefringent optical element which has thickness variations produced by local reprocessing may also be a suitable polarization-correcting optical element in this context.

The evaluation according to the invention of the optical polarization properties may furthermore be used in the scope of methods which are intended to improve the imaging properties of a pre-existing optical system even after initial use. Such a method according to the invention comprises the following steps:

evaluating optical polarization properties of the optical system according to the method described above, modifying the optical polarization properties so that the evaluation according to step c) of the method described above is improved.

The measures by which the optical polarization properties can be modified then correspond substantially to those which are appropriate for configuring the projection objective. In order to minimize upgrading of the optical system and associated production losses, however, the measures should be implementable without significant interventions on the optical systems. In this context, it is particularly suitable to use measures in which an externally operable polarization manipulator acts on an optical element. This element may, for example, be a birefringent optical element which is rotated about its symmetry axis, tilted or moved in translation with the aid of the polarization manipulator.

It is furthermore possible for the polarization manipulator to insert an optical element that affects the polarization state into the beam path, or remove it therefrom. Such an optical element may be a birefringent optical element of the aforementioned type, for example, which has thickness variations produced by local reprocessing. The polarization manipulator itself may even be arranged in the beam path, as is the case for instance with a liquid-crystal embodiment.

The superposition coefficients which have been determined may be employed directly for operating the polarization manipulator in all these cases. Specifically, for example, this may be done by inserting an optical element that affects the polarization state into the beam path as soon as the magnitude of one or more particular superposition coefficients exceeds predetermined values. This case may arise, for example, if degradation phenomena which are associated with deterioration of the optical polarization properties occur during operation of the projection exposure apparatus.

A projection exposure apparatus which is suitable for carrying out such a method comprises:

an optical system, a measuring device for measuring Jones vectors at least at some points in an exit pupil of the optical system for one or more field points, a computer, which describes the Jones vectors at least approximately as a linear superposition of predetermined vector modes with scalar superposition coefficients.

The projection exposure apparatus may have a polarization manipulator which acts on a polarization-affecting optical element as a function of at least one superposition coefficient.

In the foregoing summary of the invention it has been assumed that the state of polarization is described using the Jones vectors. However, it will be readily understood that there are other vectors that may alternatively be used to describe states of polarizations. The most important alternative formalism uses Stokes vectors having four components instead of two. Although there is no one to one correspondence between Jones vectors and Stokes vectors, the latter may equally be described as a linear superposition of predetermined vector modes with scalar superposition coefficients. As a matter of course, the vector modes then comprise four components as well.

In principle it is also possible to describe the states of polarization with other vectors, for example vectors that are derived from Jones or Stokes vectors using a linear transformation. Although such vectors are not commonly used for describing states of polarizations, there may be various advantages associated with them.

BRIEF DESCRIPTION OF THE DRAWINGS

Other features and advantages of the invention will be found in the following description of an exemplary embodiment with reference to the drawing, in which.

DESCRIPTION OF PREFERRED EMBODIMENTS

Figure 1:
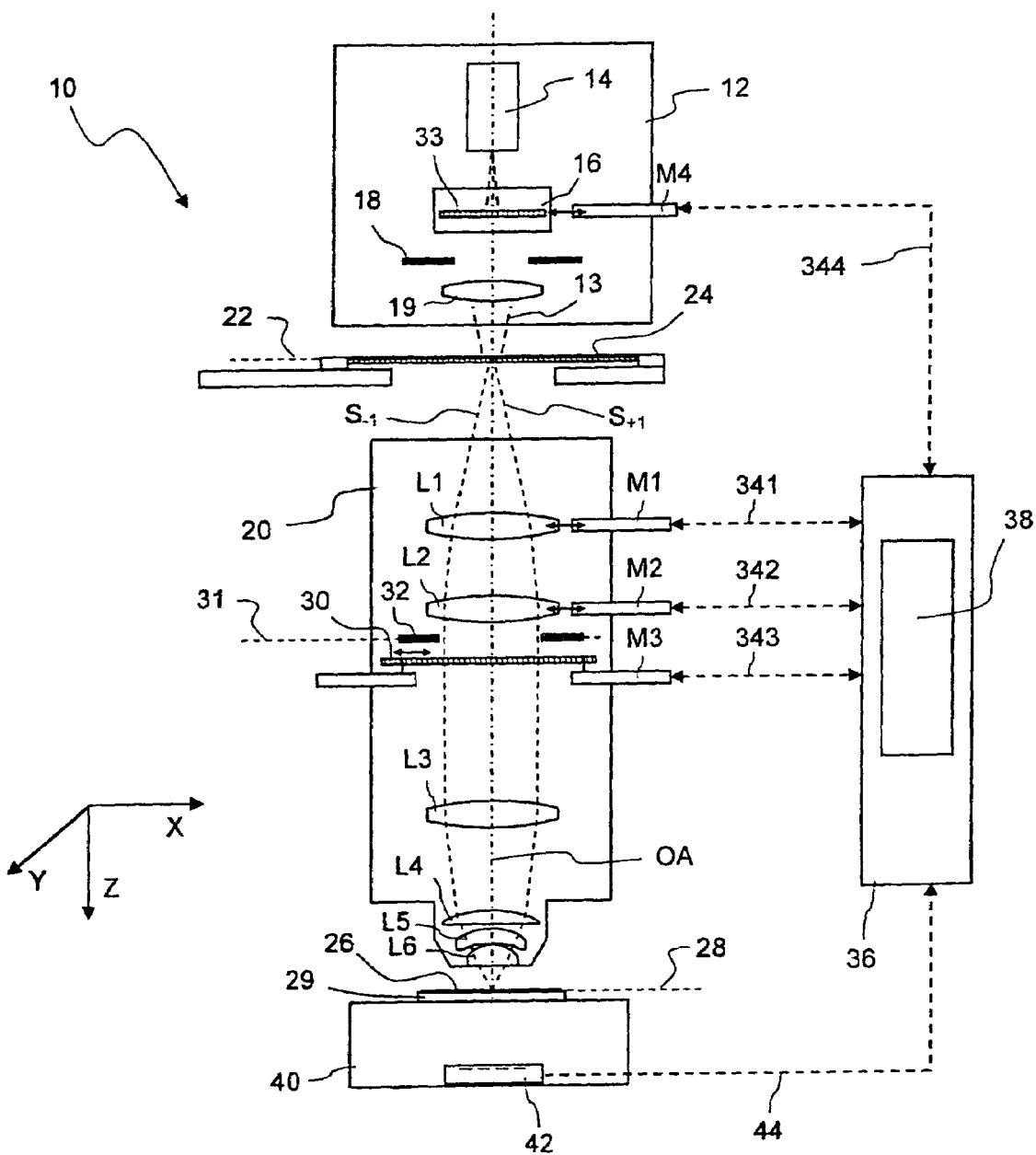
FIG. 1 shows a projection exposure apparatus according to the invention in a simplified meridian section which is not true to scale.

FIG. 1 shows a meridian section through a microlithographic projection exposure apparatus, denoted overall by 10, in a highly schematized representation which is not true to scale. The projection exposure apparatus 10 has an illumination system 12 for producing projection light 13, which comprises a light source 14, illumination optics indicated by 16 and a diaphragm 18. The illumination optics 16 make it possible to set up different illumination angle distributions. To this end, for example, the illumination device may contain interchangeable diffractive optical elements or microlens arrays. Since such illumination optics are known in the prior art, see for example U.S. Pat. No. 6,285,443 A, the content of which is fully incorporated into the subject-matter of the present application, further details of these need not be explained here.

The projection exposure apparatus 10 also has a projection objective 20 which contains a multiplicity of lenses, only some of which, denoted by L1 to L6, are represented by way of example in FIG. 1 for the sake of clarity. The projection objective 20 is used to project a reduced image of a reticle 24, which can be arranged in an object plane 22 of the projection objective 20, onto a photosensitive layer 26 which may be a photoresist, for example. The layer 26 is located in an image plane 28 of the projection objective 20 and is applied to a support 29, for example a silicon wafer. The diaphragm 18 of the illumination device 12 is imaged onto the object plane 22 with the aid of an objective indicated by 19. The light field illuminated on the reticle 24 is therefore sharply delimited at least partially.

In the exemplary embodiment represented, the lenses L1 and L2 are respectively made of a material which is birefringent. This material may be quartz glass, for example, which has stress-induced birefringence due to the production process or because it is being held in a lens frame. Cubic crystalline materials, such as calcium fluoride ($CaF_2$) or barium fluoride ($BaF_2$), are intrinsically birefringent at very short projection light wavelengths, for example 193 nm or 157 nm.

The lens L1 is assigned a first manipulator M1, which can be used to rotate the lens L1 about the optical axis OA. The lens L2 is assigned a second manipulator M2, which can be used to exert compressive or tensile forces circumferentially on the lens L2.

With the aid of a third manipulator M3, a plane-parallel birefringent plate 30 can be inserted into the beam path in the vicinity of a diaphragm plane 31, in which an entry diaphragm 32 is arranged. The plate 30 has local thickness variations, as will be explained in more detail below.

A fourth manipulator M4 acts on a plate 33, arranged inside the illumination device 12, which can be used to rotate the polarization direction continuously.

Since the manipulators M1 to M6 described above are known per se in the prior art, further details of these will not be explained here.

The manipulators M1 to M4 are connected via signal lines 341 to 344 to a control unit 36, which can be used for controlled operation of the individual manipulators M1 to M4. To this end, the control unit 36 comprises a computer 38 which, using a method which is to be explained below, determines the control instructions that should be sent to the manipulators M1 to M4 in order to improve the imaging properties of the projection objective 20.

The projection objective 20 described here by way of example is telecentric on the image side. This means that the exit pupil lies at infinity. The term exit pupil refers to the image-side image of the diaphragm plane 31, in which the entry diaphragm 32 is indicated.

The wafer 29 can be displaced in the image plane 28 in a manner which is known per se with the aid of a displacement device 40. A polarimetric measuring instrument 42 is integrated into the displacement device 40. With the wafer 29 removed from the beam path, the measuring instrument 42 makes it possible to measure the distribution of the Jones vectors (vectors of the electric field strength, optionally normalized to a global phase) in the exit pupil for different image points. Such measuring instruments are known per se in the prior art and may, for example, contain rotating quarter-wave plates. The measuring instrument 42 is connected via another signal line 44 to the control unit 36.

It will be assumed below that the imaging properties of the projection objective 20 do not yet correspond to the required specifications. For example, the contrast in the image of the reticle 24 which is formed on the photosensitive layer 26 may be overall too low for defining very small structures lithographically. If the contrast is high but nevertheless varies locally, then this leads to structure width variations which can likewise impair the functionality of the components produced with the aid of the projection exposure apparatus 10.

Such imaging errors may be caused, for example, when diffraction orders which are produced by the reticle 24 do not interfere in the intended way on the photosensitive layer 26. Full constructive or destructive interference is possible only if the interfering diffraction orders have the same polarization state.

Two diffraction orders $S_{-1}$ and $S_{+1}$, which are intended to constructively interfere in the image plane 28, are indicated by way of example in FIG. 1. If the polarization state of the diffraction orders $S_{-1}$, $S_{+1}$ is perturbed when still inside the reticle 24, or in optical elements of the projection objective 20, then in general the two diffraction orders $S_{-1}$, $S_{+1}$ will only be able to interfere incompletely in the image plane 28. This leads to an undesirable contrast loss. Polarization state perturbations may, for example, be caused by the lenses L1 to L6 when the lens material being used is intrinsically and/or stress-induced birefringent.

Besides this, there are many other causes of polarization state perturbations. For example, the reflectivity and transmissivity of optical elements for light rays which strike the faces of these elements obliquely depend on the polarizations state. Since such polarization dependency is unavoidable, this effect is also referred to as "residual polarization".

Figure 2:
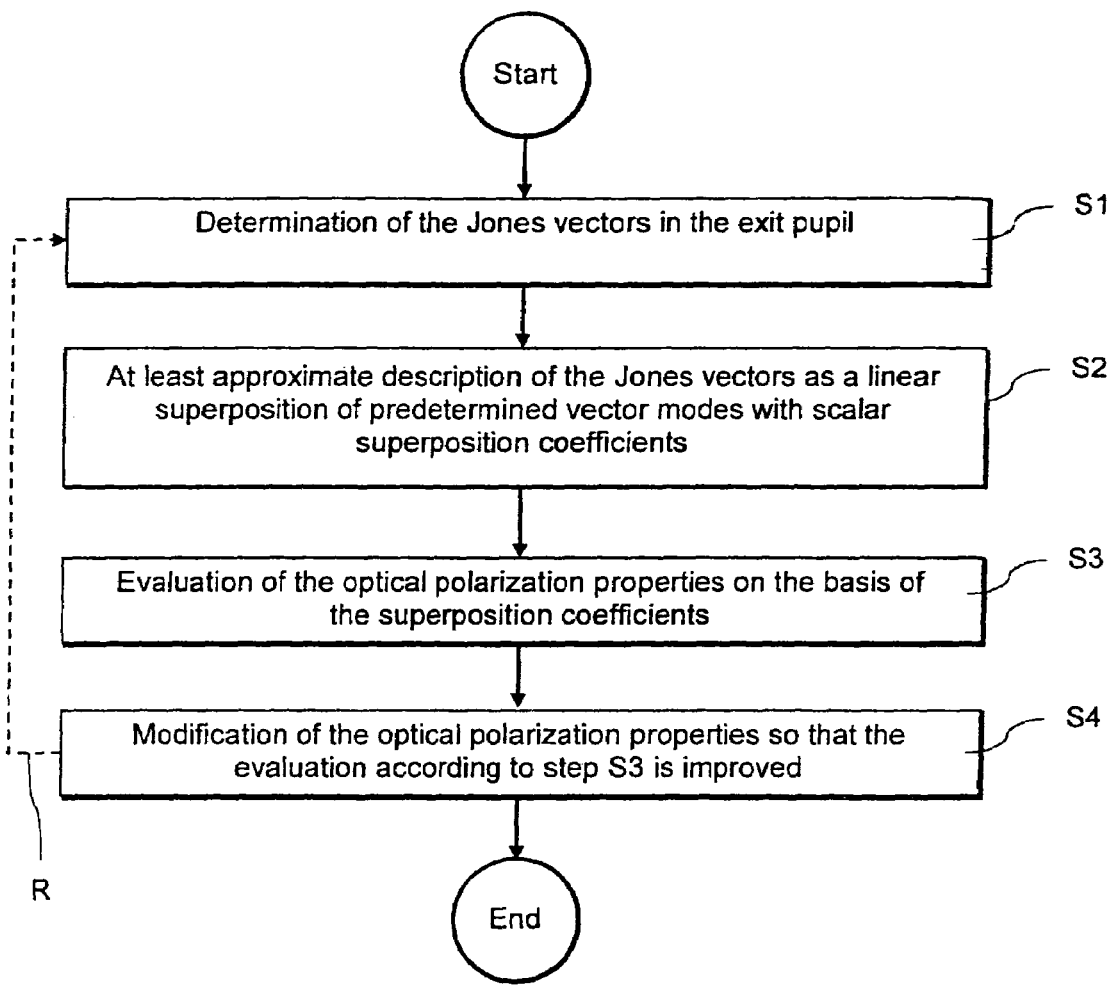
FIG. 2 shows a flow chart of a method according to the invention for improving the imaging properties of the projection objective.

A method by which the imaging properties of the projection objective 20 can be improved will be explained below with reference to the flow chart shown in FIG. 2:

Firstly, in a first step S1, the Jones vectors for a multiplicity of points in the exit pupil of the projection objective 20 are determined with the aid of the measuring instrument 42 for a particular image point.

Figure 3:
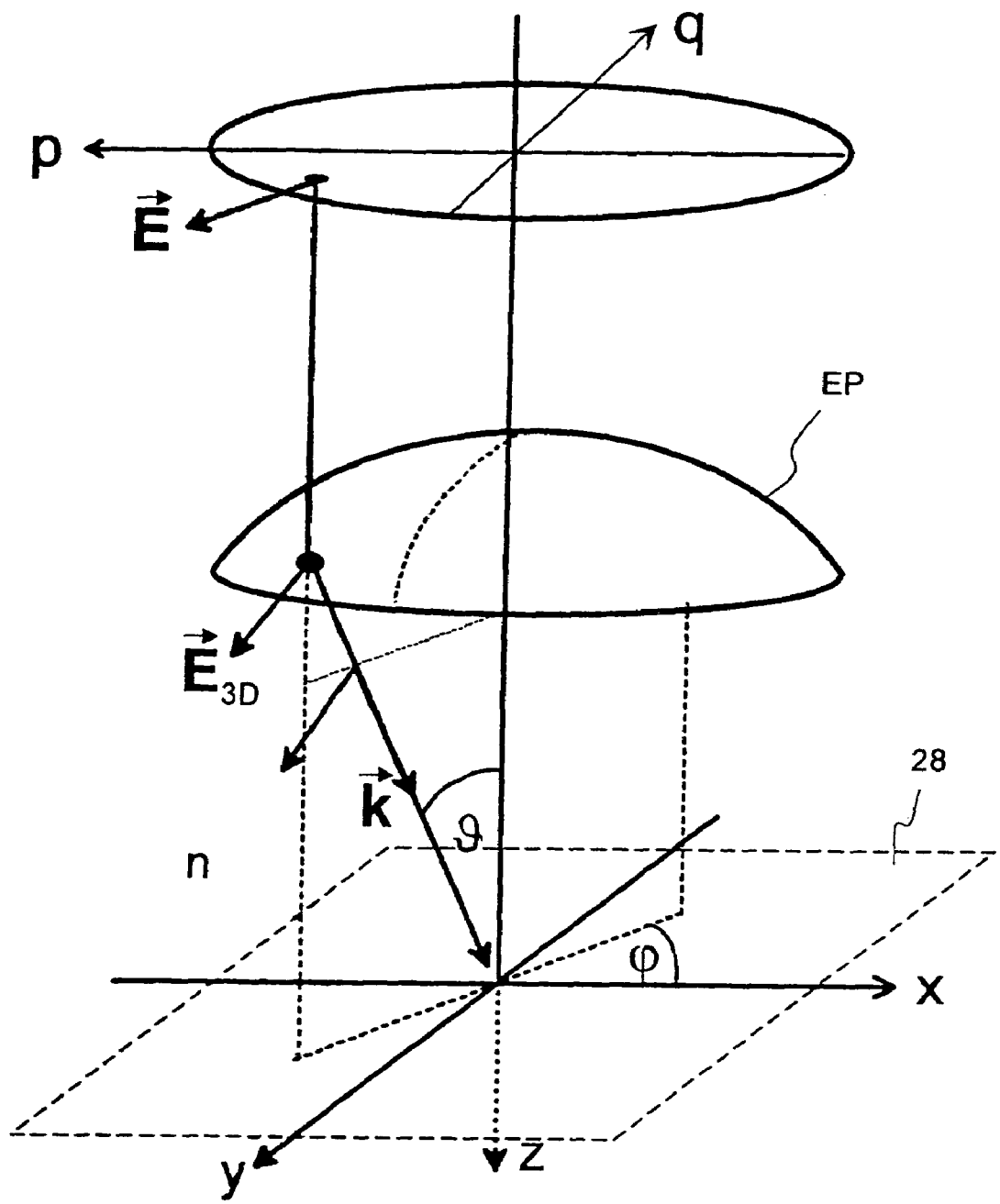
FIG. 3 shows a diagram to explain the geometrical relationships between the exit pupil and the image plane for a field point.
Figure 4D:
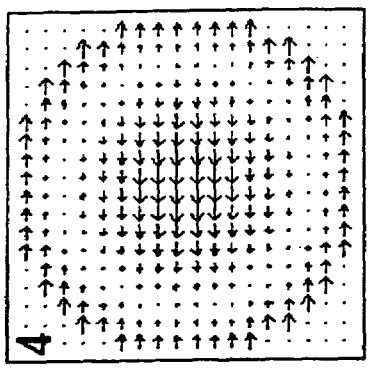
FIGS. 4a to 4h show Jones Zernike polynomials for orders 1 to 8.
Figure 5D:
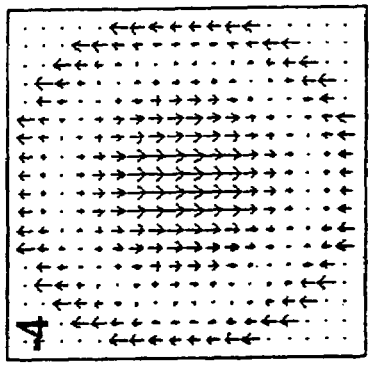
FIGS. 5a to 5h show Jones Zernike polynomials for orders −1 to −6.
Figure 4C:
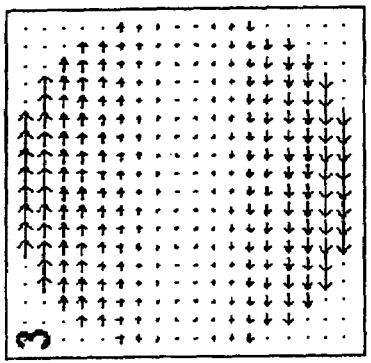
Figure 5C:
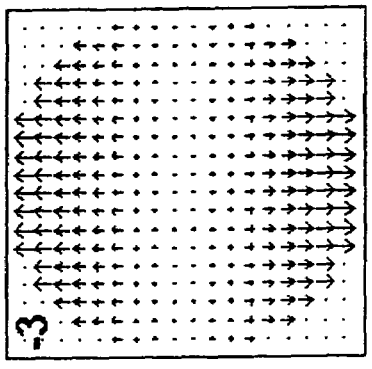
Figure 4B:
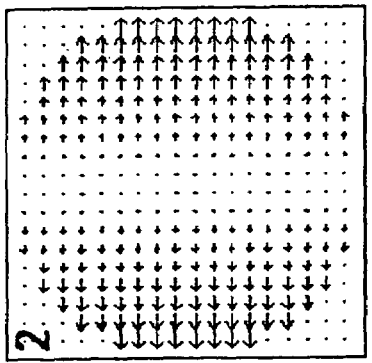
Figure 5B:
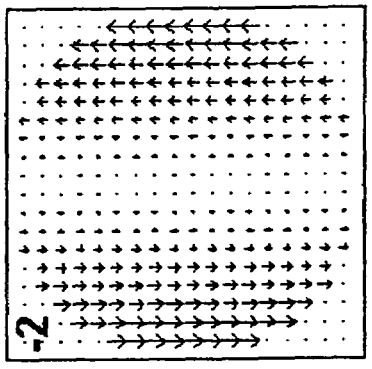
Figure 4A:
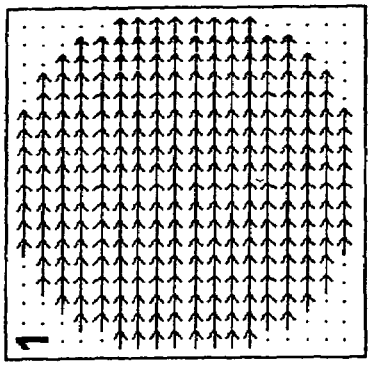
Figure 5A:
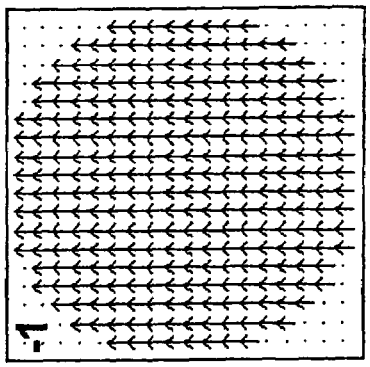
Figure 4H:
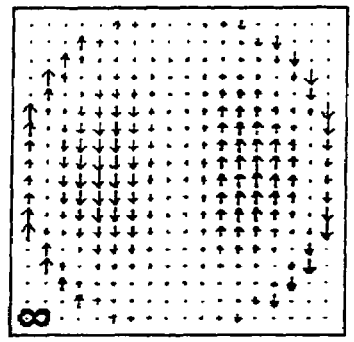
Figure 5H:
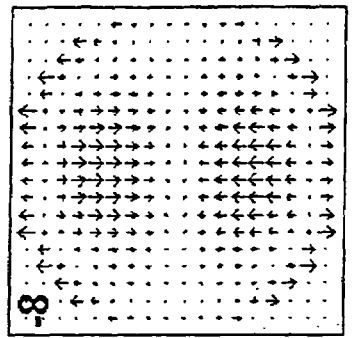
Figure 4G:
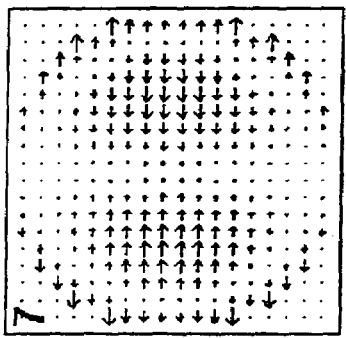
Figure 5G:
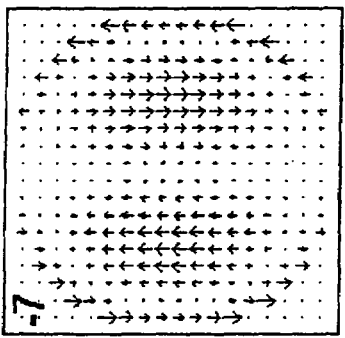
Figure 4F:
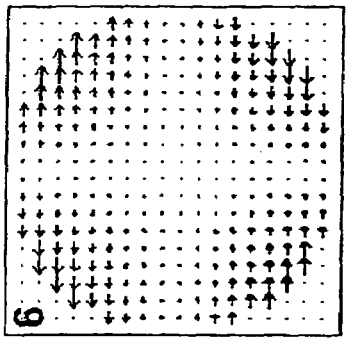
Figure 5F:
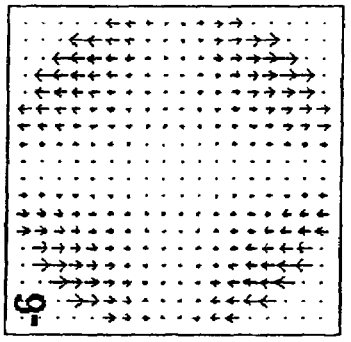
Figure 4E:
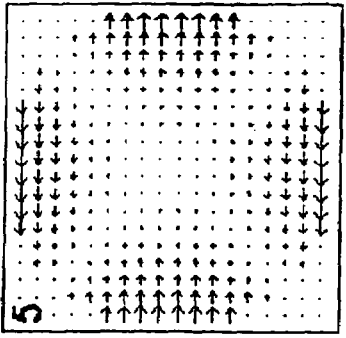
Figure 5E:
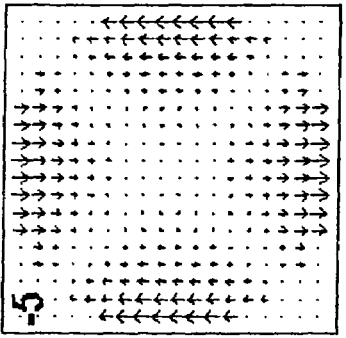
Figure 6D:
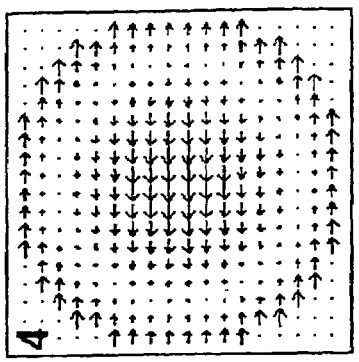
FIGS. 6a to 6h show vector Zernike polynomials for orders 1 to 8.
Figure 7D:
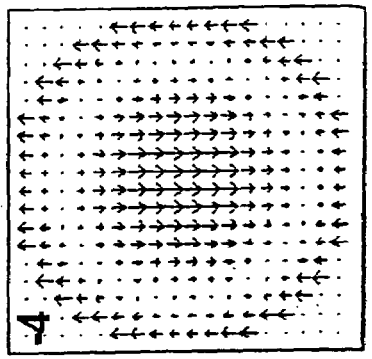
FIGS. 7a to 7h show vector Zernike polynomials for orders −1 to −8.
Figure 6C:
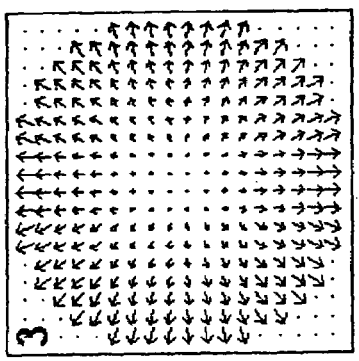
Figure 7C:
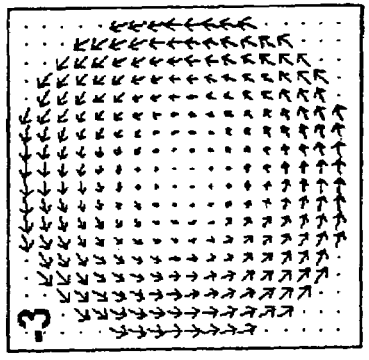
Figure 6B:
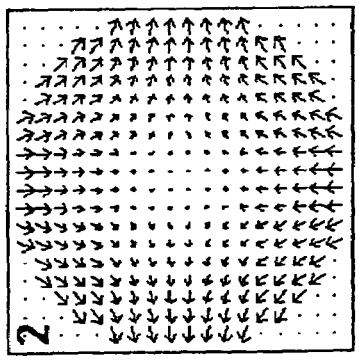
Figure 7B:
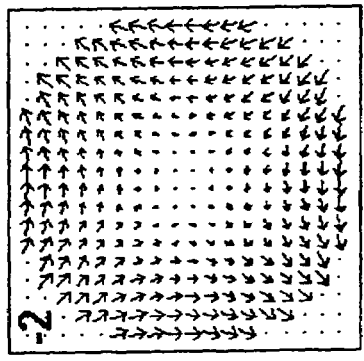
Figure 6A:
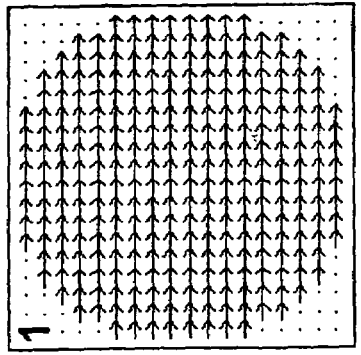
Figure 7A:
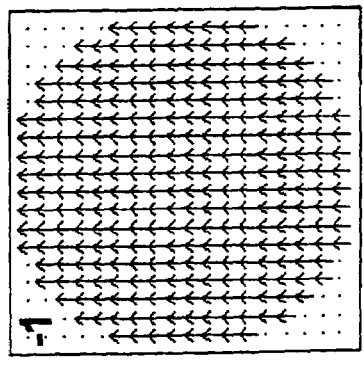
Figure 6H:
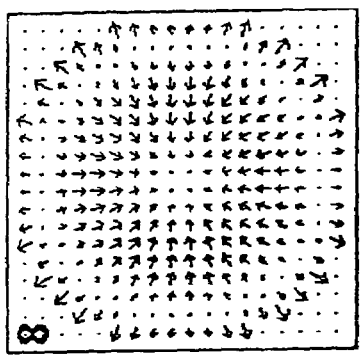
Figure 7H:
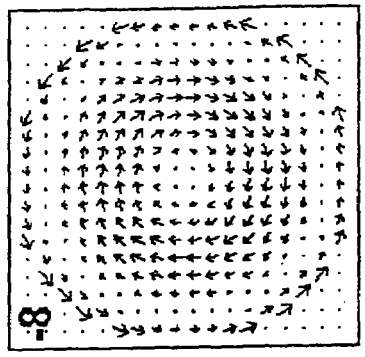
Figure 6G:
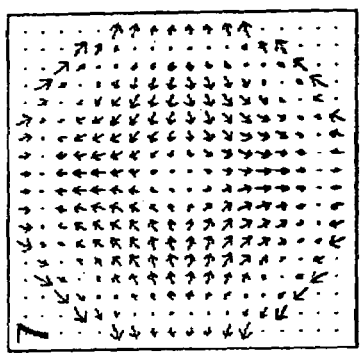
Figure 7G:
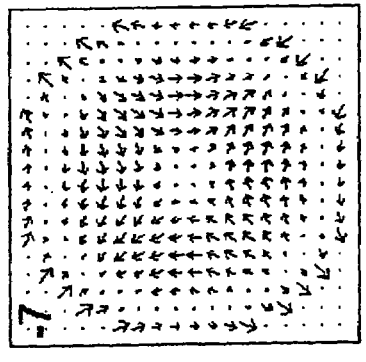
Figure 6F:
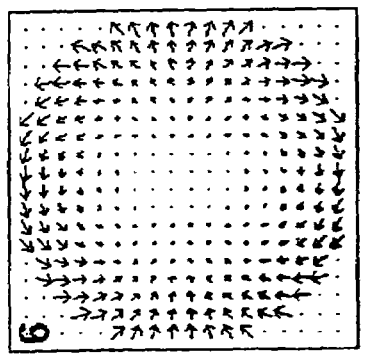
Figure 7F:
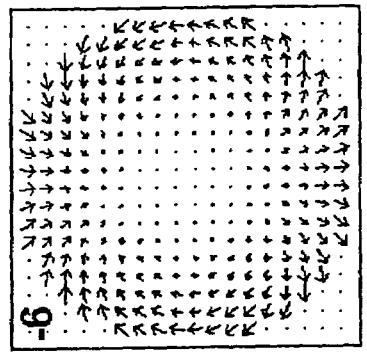
Figure 6E:
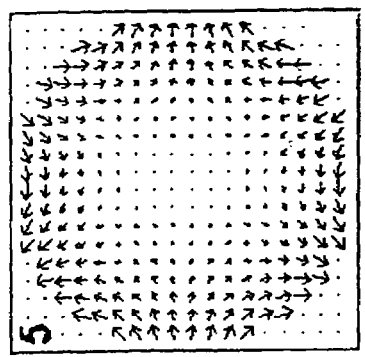
Figure 7E:
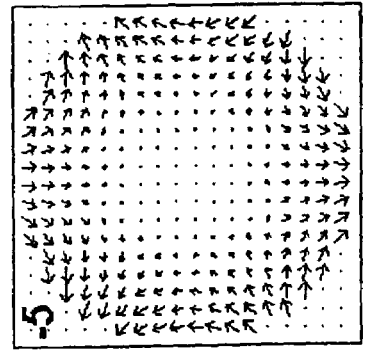

What this entails will be explained in more detail below with reference to FIG. 3. It shows the geometrical relationships between a surface, referred to below as the generalized pupil EP, and the image plane 28. The concept of the generalized pupil is used, in particular, whenever the exit pupil of an optical system lies at infinity, as is the case with telecentric projection objectives. In order to avoid dealing with quantities lying at infinity, the physical situation in the exit pupil is described in the generalized pupil. This is a sort of substitute pupil which is geometrically similar to the exit pupil but has a finite radius and lies in the image space. Since the angles occurring in the generalized pupil are the same as those in the exit pupil, the physical situation in the exit pupil can be described just as well in the generalized pupil for problems in which only the angles occurring are important. The concept of the generalized pupil is explained in more detail in an article by C. W. McCutchen entitled "Generalized aperture and the three-dimensional diffraction image", Journal of the Optical Society of America, Volume 54 (1964), pages 240-244.

Projection objectives of microlithographic projection exposure apparatus fulfill the sine condition very accurately. The generalized pupil EP for a particular image point therefore has the form of a conic surface, at the centre of which the image point lies. For the sake of simplicity, the term exit pupil will continue to be used below even though the mathematical description relates to the generalized pupil EP.

The electromagnetic field in the exit pupil is considered to be purely transverse as an approximation, so that the electric field vector $\vec{E}_{3D}$ is perpendicular to the ray direction. If the electric field vectors $\vec{E}_{3D}$ throughout the exit pupil are known for a particular image point, then the way in which the rays arriving at the image point interfere can be determined. From this, it is possible to deduce the intensity with which the photosensitive layer 26 is exposed at the image point in question.

The Jones vector of a plane electromagnetic wave in the exit pupil is equal to the vector of the electric field strength $\vec{E}_{3D}$. In general, however, it is sufficient to regard the vector of the electric field strength $\vec{E}$ merely as a two-dimensional quantity which, for the sake of simplicity, will also be referred to as a Jones vector. The Jones vector therefore has the form $$\vec{E}(p, q) = \begin{pmatrix} \tilde{E}_x(p, q) \\ \tilde{E}_y(p, q) \end{pmatrix}. \tag{1}$$

Here, $\tilde{E}_x$ and $\tilde{E}_y$ denote the complex components of the electric field strength $\vec{E}$. p, q denote dimensionless pupil coordinates for positions $\vec{\rho}$ in the exit pupil:

$$\vec{p} = \begin{pmatrix} p \\ q \end{pmatrix}. \qquad (2)$$

The pupil coordinates p, q are related to the propagation angles in the image space as follows:

$$p = n \sin \vartheta \cos \varphi$$
$$q = n \sin \vartheta \sin \varphi \qquad (3)$$

n denotes the refractive index of the medium which fills the image space in and immediately before the image plane 28. The following relation then applies for the position vectors $\vec{\rho}$ $$|\vec{\rho}| \leq n \sin \vartheta_{max} = NA, \qquad (4)$$

where $\vartheta_{max}$ is the maximum possible aperture angle and NA is the numerical aperture of the projection objective 20.

The propagation vector of a plane wave in the pupil point $\vec{\rho}$ is then written, with $k_0 = 2\pi/\lambda_0$ $$\vec{k} = k_o \begin{pmatrix} p \\ q \\ m \end{pmatrix}, \qquad (5)$$

where $$m = \sqrt{n^2 - p^2 - q^2} \qquad (6).$$

The electric field $\vec{E}_{3D}$ defined in three space directions in the exit pupil can be derived by the following transformation from the two-dimensional electric field $\vec{E}$:

$$\vec{E}_{3D}(p,q,m) = \underline{T}\vec{E}(p,q) \qquad (7)$$

with $$\underline{T} = \begin{pmatrix} \cos^2\varphi\cos\vartheta + \sin^2\varphi & -\sin\varphi\cos\varphi(1-\cos\vartheta) \\ -\sin\varphi\cos\varphi(1-\cos\vartheta) & \sin^2\varphi\cos\vartheta + \cos^2\vartheta \\ -\cos\varphi\sin\vartheta & -\sin\varphi\sin\vartheta \end{pmatrix} \qquad (8)$$

Using an inverse transformation, conversely, it is furthermore possible to calculate the two-dimensional electric field $\vec{E}$ in the exit pupil from the three-dimensional electric field $\vec{E}_{3D}$ in the exit pupil.

In order to be able to evaluate the optical polarization conditions in the image plane 28, the Jones vectors $\vec{E}$ are now described in a step S2 as a linear superposition of predetermined vector modes with scalar superposition coefficients according to $$\vec{E}(p,q) \approx \sum_i \tilde{Z}_i \vec{V}_i(p,q). \qquad (9)$$

The quantities $\vec{V}_i(p, q)$ are the vector modes, while the quantities $\tilde{Z}_i$ are the scalar, generally complex superposition coefficients. The expansion of the Jones vectors $\vec{E}$ for N image points into M vector modes $\vec{V}_i(p,q)$ may, for example, be carried out by solving the underdetermined linear equation system given below $$\sum_{j=1}^{N} A_{ij} x_j = b_i, \text{ with } i = 1, \ldots, M \qquad (10)$$

with the quantities $$A_{ij} = \begin{pmatrix} V_j^x(p_i, q_i) \\ V_j^y(p_i, q_i) \end{pmatrix} \qquad (11)$$

$$x_j = Z_j$$

$$b_i = \begin{pmatrix} E_x(p_i, q_i) \\ E_y(p_i, q_i) \end{pmatrix}$$

which may, for example, be solved by the method of least square errors. The scalar superposition coefficients $\tilde{Z}_i$ are then suitable for describing the optical polarization properties of the projection objective 20.

The system of the vector modes $\vec{V}_i(p, q)$ should be complete in the mathematical sense. Only then is it possible to describe any field distributions $\vec{E}$ in the exit pupil. The system of the vector modes $\vec{V}_i(p, q)$ should furthermore be orthogonal, since otherwise a decomposition of the Jones vectors $\vec{E}$ is not unique. In particular cases, however, it may be favorable to use vector modes $\vec{V}_i(p, q)$ which are not complete and/or orthogonal for the description. It is expedient to use such vector modes, for example, when the superposition coefficients $\tilde{Z}_i$ can be numerically determined more easily, the vector modes are physically more informative or fewer superposition coefficients $\tilde{Z}_i$ are needed overall in order to characterize the optical polarization properties.

For determining the optical polarization properties, the phase information contained in the Jones vector $\vec{E}$ is generally of little interest. It may therefore be expedient to separate the global phase from the Jones vectors $\vec{E}$ in a manner known per se according to the equation $$\vec{E}(p,q) = \exp\{i\phi_{glob}(p,q)\}\hat{E}(p,q). \qquad (12)$$

Here, $\phi_{glob}(p,q)$ denotes the phase of the plane wave and $\hat{E}(p,q)$ denotes a Jones vector normalized to the global phase. The global phase $\phi_{glob}(p,q)$ may then, for example, be expanded in a manner known per se into a polynomial system according to the equation $$\varphi_{glob}(p, q) = \sum_i A_i U_i(p, q), \quad (13)$$

where $U_i$ are scalar polynomials, for example Zernike polynomials, and $A_i$ are expansion coefficients. With separation of the global phase, it is now not the Jones vectors $\hat{E}$ but the Jones vectors $\hat{E}(p,q)$ normalized to the global phase which are described as a superposition of vector modes according to the equation $$\hat{E}(p,q) \approx \sum_i Z_i V_i(p,q). \quad (14)$$

Two possible systems of vector modes $\vec{V}_i$ (p,q), which are particularly suitable for describing the Jones vectors according to Equations (9) or (14), will be described below.

If vector modes which have non-zero components in only one dimension are selected, then this leads to a decomposition of the Jones vectors $\vec{E}$ according to $$\vec{E}(p,q) = \begin{pmatrix} \tilde{E}_x(p,q) \\ \tilde{E}_y(p,q) \end{pmatrix} \approx \sum_{j=1}^N \left[ \tilde{Z}_{jx} \vec{V}_{jx} + \tilde{Z}_{jy} \vec{V}_{jy} \right] \quad (15)$$

with $$\vec{V}_{jx} = \begin{pmatrix} U_j(p,q) \\ 0 \end{pmatrix} \text{ and } \vec{V}_{jy} = \begin{pmatrix} 0 \\ U_j(p,q) \end{pmatrix}. \quad (16)$$

If the Zernike polynomials often used for the description of wavefronts are selected for the components $U_j$, according to $$U_j(p,q) = R_n^m(r)\Phi(l\theta) \text{ with } j=(n,m,l), \quad (17)$$

then the vector modes $\vec{V}_{jx}$ and $\vec{V}_{jy}$ referred to below as Jones Zernike modes form a complete orthogonal function system. The orthogonality of two vector modes $\vec{V}_{jx}$ and $\vec{V}_{kx}$ for the same dimension x or y follows from the orthogonality of the Zernike polynomials $U_j$, $U_k$. Vector modes $\vec{V}_{jx}$ and $\vec{V}_{ky}$ in different dimensions are orthogonal owing to Equation (16). The completeness of the function system follows from the completeness of the Zernike polynomials $U_j$.

If the vector modes $\vec{V}_{jy}$ are denoted by negative orders $-j$, then Equations (15) and (16) can be written as $$\vec{E}(p,q) \approx \sum_{j=-N}^N \tilde{Z}_j \vec{V}_j(p,q) \quad (18)$$

with $$\vec{V}_{+j} = \begin{pmatrix} U_j(p,q) \\ 0 \end{pmatrix}, \vec{V}_{-j} = \begin{pmatrix} 0 \\ U_j(p,q) \end{pmatrix}. \quad (19)$$

FIGS. 4a to 4h and FIGS. 5a to 5h show graphical representations of the Jones Zernike modes $\vec{V}_{+j}$ and $\vec{V}_{-j}$, respectively, for the first eight orders j=1 ... 8. In FIGS. 4a to 4h and 5a to 5h, it can be seen that the Jones Zernike modes of equal order number can be converted into one another by rotating the polarization direction through 90°. The distributions of the magnitude and orientation of the Jones vectors within the modes are respectively similar to the known scalar distributions of the Zernike polynomials, by which phases of electromagnetic waves can be described. The two Jones Zernike modes with the orders j=1 and j=−1 in this case describe a DC part which is constant over the entire exit pupil.

Another possible function system for vector modes, into which the Jones vectors according to Equation (14) can be decomposed, is given by $$\vec{V}_j = \vec{W}_{nm\epsilon} = R_n^m(r)\vec{\Phi}_{m\epsilon}(\phi), \epsilon=0, 1. \quad (20)$$

These modes $\vec{W}_{nm\epsilon}$ referred to below as vector Zernike modes, contain a radial part $R_n^m(r)$ which is equal to the radial part of the known Zernike polynomials $U_j$ according to Equation (17). The part $\vec{\Phi}_{m\epsilon}(\phi)$ dependent on the azimuth angle $\phi$ is given by $$\vec{\Phi}_{m0} = \begin{pmatrix} \cos m\varphi \\ -\sin m\varphi \end{pmatrix}, \vec{\Phi}_{-m0} = \begin{pmatrix} \cos m\varphi \\ -\sin m\varphi \end{pmatrix}, \quad (21)$$
$$\vec{\Phi}_{m1} = \begin{pmatrix} \sin m\varphi \\ \cos m\varphi \end{pmatrix}, \vec{\Phi}_{-m1} = \begin{pmatrix} \sin m\varphi \\ \cos m\varphi \end{pmatrix}$$

or, written in a simplified form, $$\vec{\Phi}_{m\epsilon} = \begin{pmatrix} \cos(\epsilon\pi/2) & -\sin(\epsilon\pi/2) \\ \sin(\epsilon\pi/2) & \cos(\epsilon\pi/2) \end{pmatrix} \begin{pmatrix} \cos m\varphi \\ -\sin m\varphi \end{pmatrix}, \epsilon=0, 1. \quad (22)$$

The vector Zernike modes $\vec{W}_{nm\epsilon}$ likewise form a complete orthogonal function system, and are therefore suitable for describing Jones vectors in the exit pupil. The evaluation of different polarization-dependent image errors, however, is somewhat simpler to carry out with the Jones Zernike modes according to Equation (19).

Table 1 below indicates the allocation to the indices n, m and $\epsilon$ for the orders j=±1 to j=±6. For the orders j=±1 and j=±4, m=0 so that these vector Zernike modes are independent of angle. This can also be seen from FIGS. 6a to 6h and 7a to 7h, which show the vector Zernike modes $\vec{W}_{nm\epsilon}$ for the orders j=1 to 8 and j=−1 to −8, respectively.

If the Jones Zernike modes according to Equations (16) and (17) are likewise decomposed into a radial part and an angle-dependent part, then the following is obtained for the angle-dependent part $\vec{\Phi}_{m0}$ $$\vec{\Phi}_{m0} = \begin{pmatrix} \cos m\varphi \\ 0 \end{pmatrix}, \quad \vec{\Phi}_{-m0} = \begin{pmatrix} \sin m\varphi \\ 0 \end{pmatrix}, \quad (23)$$

$$\vec{\Phi}_{m1} = \begin{pmatrix} 0 \\ \cos m\varphi \end{pmatrix}, \quad \vec{\Phi}_{-m1} = \begin{pmatrix} 0 \\ \sin m\varphi \end{pmatrix}$$

The Jones Zernike modes according to Equations (16) and (17) can thus be mutually converted into the vector Zernike modes according to Equations (20) and (21) by the basis transformation according to $$\begin{pmatrix} \Phi_j^{Jon} \\ \Phi_{-j}^{Jon} \\ \Phi_{j+1}^{Jon} \\ \Phi_{-j-1}^{Jon} \end{pmatrix} = \begin{pmatrix} 1 & 0 & 1 & 0 \\ 0 & 1 & 0 & 1 \\ 0 & 1 & 0 & -1 \\ -1 & 0 & 1 & 0 \end{pmatrix} \begin{pmatrix} \Phi_j^{vec} \\ \Phi_{-j}^{vec} \\ \Phi_{j+1}^{vec} \\ \Phi_{-j-1}^{vec} \end{pmatrix} \quad (24)$$

TABLE 1

Allocation of the orders j to the indices n, m and $\epsilon$ for the vector Zernike polynomials.

| j | 1 | -1 | 2 | -2 | 3 | -3 | 4 | -4 | 5 | -5 | 6 | -6 |
|---|---|----|---|----|---|----|---|----|---|----|---|----|
| n | 0 | 0  | 1 | 1  | 1 | 1  | 2 | 2  | 2 | 2  | 2 | 2  |
| m | 0 | 0  | 1 | 1  | -1| -1 | 0 | 0  | 2 | 2  | -2| -2 |
| $\epsilon$ | 0 | 1 | 0 | 1 | 0 | 1 | 0 | 1 | 0 | 1 | 0 | 1 |

The generally complex superposition coefficients $\tilde{Z}_i$ according to Equation (14) can now be used in a step S3 to evaluate the optical polarization properties of the projection objective 20. Similarly as the Zernike coefficients are used for expanding the scalar phase into the Zernike polynomials in order to describe wavefront errors in the exit pupil, for example, the superposition coefficients $\tilde{Z}_i$ can be employed to describe and evaluate the optical polarization properties of the projection objective 20.

The superposition coefficients $\tilde{Z}_i$ therefore make it possible to describe deviations of the Jones vectors in the exit pupil for a given point in the image plane 28 from a target distribution of the Jones vectors in a straightforward and physically informative way. If particular superposition coefficients $\tilde{Z}_i$ lie above a predetermined threshold value, for example, then measures may be taken in a step S4 in order to deliberately modify the optical polarization properties and thereby improve the imaging behavior of the projection objective 20. By feedback, which is indicated by a dashed line R in FIG. 2, it is possible to repeat steps S1 to S4 until the modification of the optical polarization properties has led to a sufficient improvement in the imaging properties. The measures for modifying the optical polarization properties may, for example, involve rotating the birefringent lens L1 with the aid of the manipulator M1. Since the birefringence distribution of the lens L1 is generally not, or not exactly rotationally symmetric, rotation of the lens L1 about the optical axis OA leads to a modified distribution of the Jones vectors in the exit pupil EP of the projection objective 20.

Another measure may consist in exerting compressive and/or tensile forces circumferentially on the lens L2 with the aid of the manipulator M2. The material stresses caused by this induce a birefringence, the distribution of which can be influenced by the spatially controlled action of the compressive and/or tensile forces.

Another measure for improving the optical polarization properties may consist in inserting the plane-parallel plate 30 made of a birefringent material into, or in the vicinity of the pupil plane EP with the aid of the manipulator M3. The plane-parallel plate 30 is in this case reprocessed locally, for example by material erosion, so that its thickness varies slightly. The thickness variations may be of the order of from a few nanometers to several micrometers, and they are designed so that the insertion of the plane-parallel plate 30 leads to an improvement in the optical polarization properties. Such plates are described, for example, in U.S. Pat. No. 6,252,712 B1 and DE 103 28 938 (not yet published), the entire disclosure of which is hereby incorporated into the present application by reference. As a result of additional measures, for example in the form of compensating plates, it is possible for the thickness variations to affect only the polarization state and not the phase of the transmitted light.

The plate 30 may, for example, be inserted whenever the optical polarization properties have deteriorated as a result of reversible or irreversible degradation phenomena in optical elements of the projection objective 20. Such degradation phenomena, which are generally caused by the energetic projection light, can often be predicted very well by simulation so that, within certain limits, it is possible to forecast the way in which the optical polarization properties of the projection objective 20 will change after some time. The plate 30 is then designed so that it compensates as much as possible for the modifications which the optical polarization properties have experienced. If there is further degradation of the optical elements in the projection objective 20, then the plate 30 may be replaced by another plate whose production has taken into account the optical polarization properties of the projection objective 20 at a later time.

Using the manipulator M4, it is possible to rotate the polarization direction of the projection light arriving on the reticle 24. This also represents a measure which can sometimes be used to correct polarization-induced imaging errors that have occurred.

In the exemplary embodiment described above, it was assumed that the Jones vectors in the exit pupil EP are determined with the aid of the measuring instrument 42. Particularly in connection with the configuration of a projection objective to be newly designed, it may nevertheless be more expedient to determine the Jones vectors in the exit pupil EP by simulation. Simulation programs, which determine the Jones vectors in the exit pupil for any rays in optical systems, are known in the prior art and can be used for this purpose. The superposition coefficients $\tilde{Z}_i$ may then, for example, be incorporated into a quality function which is used for evaluation of the imaging properties of the projection objective 20. With the aid of optimization methods which are known per se, the projection objective 20 can then be configured so that the quality function is close to its target value.

In the modified design by which the quality function is improved, for example, it is possible to employ the same measures as those explained above in respect of correction during the service life of the projection objective 20. Here, however, it is also feasible to use measures which could no longer be carried retrospectively on the projection objective once it has been installed or put into operation. This, for example, may involve fitting birefringent plane-parallel plates with local thickness variations, as described above. The thickness variations may in this case be designed so that they optimally correct existing polarization perturbations.

In the exemplary embodiments described above, the projection objective 20 of the projection exposure apparatus 10 was evaluated and optionally corrected with respect to its optical polarization properties. In the scope of the present invention, it is of course also possible for the illumination device 12 to be described and optionally corrected in a similar way. The illumination device 12 likewise has an exit pupil in which Jones vectors can be defined. If need be, the description and correction may moreover be carried out only for a subcomponent of the illumination device 12. The objective 19, which projects a sharp image of the diaphragm 18 onto the object plane 22, is particularly relevant in this context.

The description of the Jones vectors may also be advantageously used during simulations of the image of a given reticle obtained in an image plane of a projection objective. In the course of such simulations it may be found, for example, that for certain types of reticles or pattern orientations certain superposition coefficients become more prominent. On the basis of these coefficients it is often possible to (at least approximately) locate causes, for example certain lenses or lens coatings, that are responsible for the disturbances.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. A method for evaluating optical polarization properties of an optical system of a microlithographic projection exposure apparatus, comprising the following steps:
   a) determining the Jones or Stokes vectors at least at plural points in an exit pupil of the optical system for at least one field point;
   b) at least approximately describing the Jones or Stokes vectors determined in the step a) as a linear superposition of predetermined vector modes with scalar superposition coefficients; and
   c) evaluating the optical polarization properties on the basis of the superposition coefficients.

2. The method of claim 1, wherein the Jones vectors described in the step b) are normalized to a global phase.

3. The method of claim 1, wherein the vector modes form a complete function system.

4. The method of claim 1, wherein the vector modes form an orthogonal function system.

5. The method of claim 1, wherein the components of the vector modes are Zernike polynomials.

6. The method of claim 5, wherein only one component of each vector mode is non-zero.

7. The method of claim 1, wherein the Jones or Stokes vectors are approximated in the step b) by $$\vec{E}(p, q) \approx \sum_{j=-N}^{N} \tilde{Z}_j \vec{V}_j(p, q),$$

where $\vec{E}(p, q)$ is the Jones or Stokes vector for a point P with the coordinates (p, q) in the pupil plane, j, N are natural numbers, $\tilde{Z}_j$ are complex superposition coefficients and $\vec{V}_j(p, q)$ are the vector modes.

8. The method of claim 7, wherein only one component of each vector mode is non-zero, and wherein, for the case of Jones vectors, the vector modes $\vec{V}_j(p, q)$ are given by $$\vec{V}_{+j} = \begin{pmatrix} U_j(p, q) \\ 0 \end{pmatrix}, \quad \vec{V}_{-j} = \begin{pmatrix} 0 \\ U_j(p, q) \end{pmatrix},$$

where $\vec{V}_{+j}$ is a vector mode for positive j, $\vec{V}_{-j}$ is a vector mode for negative j and $U_j(p, q)$ is a Zernike polynomial of order j.

9. The method of claim 7, wherein, for the case of Jones vectors, the vector modes $\vec{V}_j(p, q)$ are given by $$\vec{V}_j(p,q) = \vec{W}_{nm\epsilon} = R_n^m \vec{\Phi}_{m\epsilon},$$

where $\vec{W}_{nm\epsilon}$ is a vector Zernike polynomial, $R_n^m$ is the radial component of a Zernike polynomial of order j, and $\vec{\Phi}_{m\epsilon}$ is given by $$\vec{\Phi}_{m\epsilon} = \begin{pmatrix} \cos(\epsilon\pi/2) & -\sin(\epsilon\pi/2) \\ \sin(\epsilon\pi/2) & \cos(\epsilon\pi/2) \end{pmatrix} \begin{pmatrix} \cos m\varphi \\ -\sin m\varphi \end{pmatrix}$$

with m=n−2k and k=0, 1, ..., n and ε=0, 1, the order number j being linked with m, k and ε through the following table:

| j | 1 | −1 | 2 | −2 | 3 | −3 | 4 | −4 | 5 | −5 | 6 | −6 |
|---|---|----|---|----|---|----|---|----|---|----|---|----|
| n | 0 | 0  | 1 | 1  | 1 | 1  | 2 | 2  | 2 | 2  | 2 | 2  |
| m | 0 | 0  | 1 | 1  | −1| −1 | 0 | 0  | 2 | 2  | −2| −2 |
| ε | 0 | 1  | 0 | 1  | 0 | 1  | 0 | 1  | 0 | 1  | 0 | 1  | for the orders j=±1 to j=±6.

10. The method of claim 1, wherein the Jones or Stokes vectors are determined by means of a measurement in the step a).

11. The method of claim 1, wherein the Jones or Stokes vectors are determined by simulation in the step a).

12. A method for producing an optical system of a microlithographic projection exposure apparatus, comprising the following steps:
   compiling a design for the optical system;
   evaluating optical polarization properties of the designed optical system according to the method of claim 1;
   establishing a quality function which incorporates superposition coefficients determined in the step b); and
   compiling a modified design so that the quality function is improved.

13. The method of claim 12, wherein the optical polarization properties are determined by simulation.

14. The method of claim 12, wherein the optical system according to the modified design contains a polarization-correcting optical element.

15. The method of claim 14, wherein the polarization-correcting optical element is a birefringent optical element which has locally varying thickness variations that are non-rotationally symmetrical.

16. The method of claim 14, wherein the polarization-correcting optical element is a predominantly transmissive or a predominantly reflective coating of an optical element.

17. The method of claim 16, wherein the coating comprises at least two layers.

18. A method for improving the optical polarization properties of a projection objective of a microlithographic projection exposure apparatus, comprising the following steps:

evaluating optical polarization properties of the projection objective in accordance with the method of claim 1, modifying the optical polarization properties so that the evaluation according to the step c) is improved.

19. The method of claim 18, wherein the optical polarization properties are modified with the aid of a polarization manipulator.

20. The method of claim 19, wherein the polarization manipulator is operated when the magnitude of at least one superposition coefficient exceeds a predetermined value.

21. The method of claim 19, wherein the polarization manipulator acts on a birefringent optical element.

22. The method of claim 21, wherein the polarization manipulator rotates the birefringent element about its symmetry axis, tilts it or shifts it.

23. The method of claim 19, wherein the polarization manipulator exerts compressive or tensile forces on an optical element in order to produce a stress-induced birefringence.

24. The method of claim 19, wherein an optical element affecting the polarization state is inserted into the beam path or is removed therefrom by the polarization manipulator in order to modify the optical polarization properties.

25. A method for describing optical polarization properties of an optical system of a microlithographic projection exposure apparatus, comprising the following steps:
   a) determining the Jones or Stokes vectors at least at plural points in an exit pupil of the optical system for at least one field point;
   b) at least approximately describing the Jones or Stokes vectors determined in the step a) as a linear superposition of predetermined vector modes with scalar superposition coefficients; and
   c) using the superposition coefficients to describe the optical polarization properties of the optical system.

26. An optical system of a microlithographic projection exposure apparatus, which is specified by the scalar superposition coefficients determined by the method of claim 25.

27. A method of simulating the image of a reticle formed in an image plane of a projection objective of a microlithographic exposure apparatus, comprising the steps of:
   a) simulating the Jones or Stokes vectors at least at plural points in an exit pupil of the optical system for at least one field point;
   b) at least approximately describing the Jones or Stokes vectors determined in the step a) as a linear superposition of predetermined vector modes with scalar superposition coefficients; and
   c) providing information relating to the optical polarization properties of the projection objective on the basis of the superposition coefficients.

* * * * *